(12) United States Patent
Wakita et al.

(10) Patent No.: US 8,558,390 B2
(45) Date of Patent: Oct. 15, 2013

(54) SEMICONDUCTOR DEVICE

(75) Inventors: Naoki Wakita, Kawasaki (JP);
Shigeyuki Hayakawa, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/596,465

(22) Filed: Aug. 28, 2012

(65) Prior Publication Data

US 2013/0140687 A1  Jun. 6, 2013

(51) Int. Cl.
*H01L 23/52* (2006.01)
*H01L 23/48* (2006.01)
*H01L 29/40* (2006.01)

(52) U.S. Cl.
USPC .......... 257/774; 257/E23.145; 257/758; 257/773; 438/629; 438/667; 438/668

(58) Field of Classification Search
USPC .......... 257/E23.011, E23.145, E23.174, 758, 257/773–775; 438/629, 637, 639, 640, 667, 438/668, 672, 675, 700, 701, 713, 978, 118, 438/622
See application file for complete search history.

(56) References Cited

U.S. PATENT DOCUMENTS

| | | | | |
|---|---|---|---|---|
| 5,969,421 | A | 10/1999 | Smooha | |
| 7,586,175 | B2 * | 9/2009 | Lee et al. | 257/620 |
| 7,911,063 | B2 * | 3/2011 | Terazono et al. | 257/776 |
| 7,977,238 | B2 * | 7/2011 | Funakoshi et al. | 438/637 |
| 8,174,124 | B2 * | 5/2012 | Chiu et al. | 257/773 |
| 8,183,602 | B2 * | 5/2012 | Tabata et al. | 257/211 |
| 8,227,902 | B2 * | 7/2012 | Kuo | 257/659 |
| 8,269,316 | B2 * | 9/2012 | Kuo et al. | 257/621 |
| 8,310,056 | B2 * | 11/2012 | Oda et al. | 257/773 |
| 8,384,207 | B2 * | 2/2013 | Toshima et al. | 257/698 |
| 2005/0001326 | A1 * | 1/2005 | Masuda | 257/774 |
| 2005/0023700 | A1 * | 2/2005 | Singh et al. | 257/773 |
| 2005/0173806 | A1 * | 8/2005 | Matsubara | 257/774 |
| 2006/0006547 | A1 * | 1/2006 | Matsunaga | 257/774 |
| 2007/0145601 | A1 * | 6/2007 | Morrow | 257/774 |
| 2008/0012147 | A1 * | 1/2008 | Watanabe | 257/774 |
| 2008/0136043 | A1 * | 6/2008 | Ohtake et al. | 257/774 |
| 2008/0258262 | A1 * | 10/2008 | Nagai | 257/535 |
| 2009/0160020 | A1 * | 6/2009 | Barth et al. | 257/532 |
| 2009/0309232 | A1 * | 12/2009 | Roy | 257/774 |
| 2010/0171226 | A1 * | 7/2010 | West et al. | 257/774 |

FOREIGN PATENT DOCUMENTS

JP    11-243144    11/1998

OTHER PUBLICATIONS

Toshiba, Background Art Information Sheet, dated Mar. 26, 2012 and Apr. 26, 2012.

* cited by examiner

*Primary Examiner* — Chris Chu
(74) *Attorney, Agent, or Firm* — Knobbe, Martens, Olson and Bear, LLP

(57) ABSTRACT

According to one embodiment, provided is a semiconductor device including a lower layer wiring, and an upper layer wiring that is drawn in the same direction as a direction in which the lower layer wiring is drawn. Intermediate wirings include at least a first intermediate wiring and a second intermediate wiring. Conductors include at least a plurality of first conductors connecting between the lower layer wiring and the first intermediate wiring, a plurality of second conductors connecting between the upper layer wiring and the second intermediate wiring, and a plurality of third conductors which connect between the first intermediate wiring and the second intermediate wiring, and are less in number than the first conductors or the second conductors on a drawn side of the lower layer wiring and the upper layer wiring.

19 Claims, 6 Drawing Sheets

SEMICONDUCTOR DEVICE

CROSS-REFERENCE TO RELATED APPLICATIONS

This application is based upon and claims the benefit of priority from Japanese Patent Application No. 2011-267085, filed on Dec. 6, 2011; the entire contents of which are incorporated herein by reference.

FIELD

Embodiments disclosed herein relate generally to a semiconductor device.

BACKGROUND

To perform interlayer connection in a multilayer wiring, conductors are buried in a matrix form in an insulating film formed between wiring layers. In this instance, when a current is turned back between an upper layer wiring and a lower layer wiring, a current density becomes non-uniform in the conductors, and a large current may flow in a portion of the conductors.

DETAILED DESCRIPTION

In general, according to one embodiment, a semiconductor device including a lower layer wiring, and an upper layer wiring that is disposed over the lower layer wiring interposing two or more layers of intermediate wirings and conductors connecting between respective intermediate wirings between the lower layer wiring and the upper layer wiring, and is drawn in the same direction as a direction in which the lower layer wiring is drawn. The two or more layers of intermediate wirings include at least a first intermediate wiring provided between the lower layer wiring and the upper layer wiring, and a second intermediate wiring provided between the first intermediate wiring and the upper layer wiring. The conductors include at least a plurality of first conductors connecting between the lower layer wiring and the first intermediate wiring, a plurality of second conductors connecting between the upper layer wiring and the second intermediate wiring, and a plurality of third conductors which connect between the first intermediate wiring and the second intermediate wiring, and are less in number than the first conductors or the second conductors on a drawn side of the lower layer wiring and the upper layer wiring.

Hereinafter, a semiconductor device according to embodiments will be described with reference to the drawings. Note that the present invention is not limited to the embodiments.

First Embodiment

Figure 1:
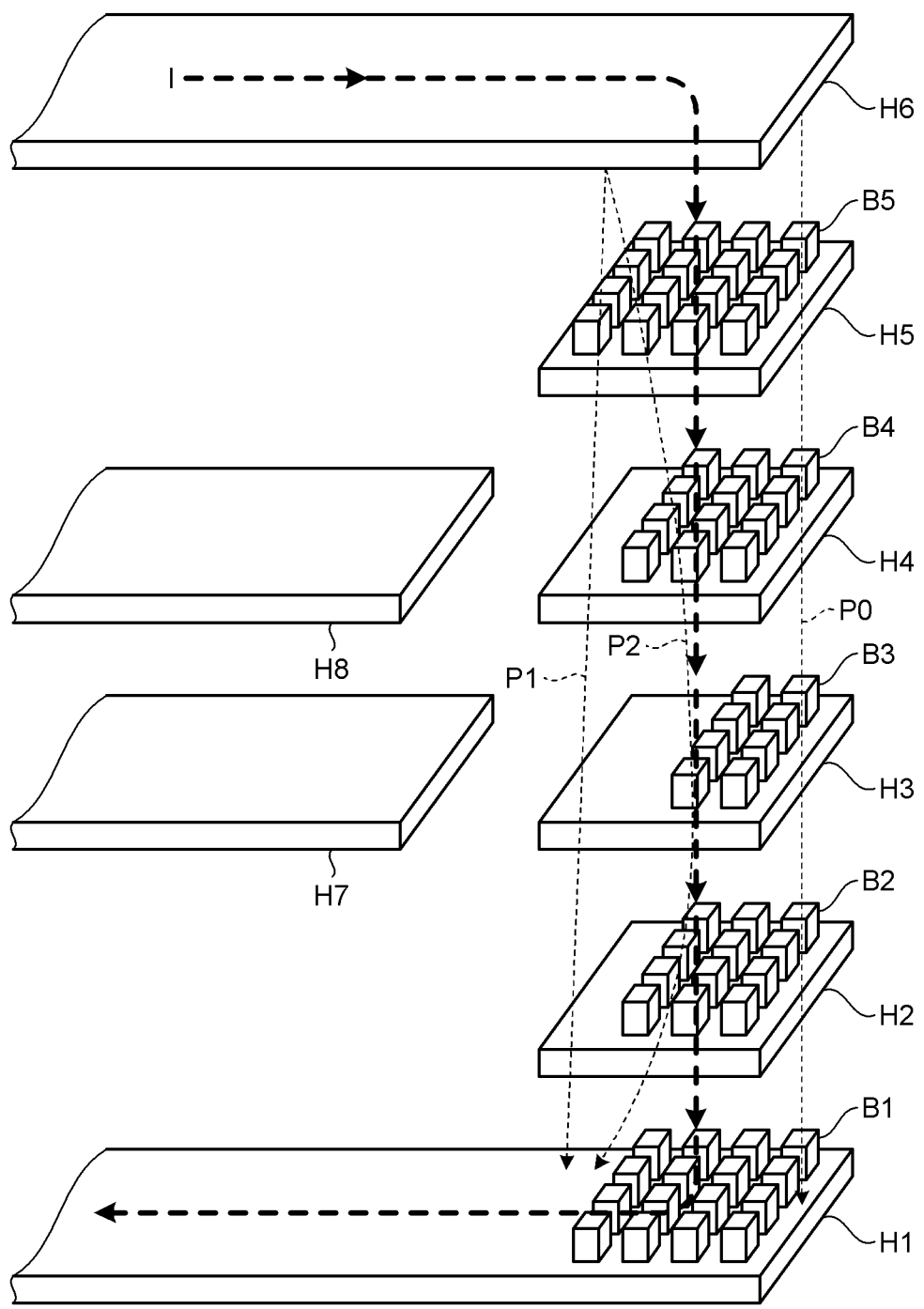
FIG. 1 is a perspective view illustrating a schematic configuration of a semiconductor device disassembled into respective wiring layers according to a first embodiment.

FIG. 1 is a perspective view illustrating a schematic configuration of a semiconductor device disassembled into respective wiring layers according to a first embodiment.

Referring to FIG. 1, an upper layer wiring H6 is formed over a lower layer wiring H1, and the lower layer wiring H1 and the upper layer wiring H6 are drawn out in the same direction. Here, two or more intermediate layers are provided between the lower layer wiring H1 and the upper layer wiring H6. In the intermediate layers, intermediate wirings H2 to H5, H7, and H8 are provided, and the intermediate wirings H2 to H5 are used to connect the lower layer wiring H1 with the upper layer wiring H6. Further, the intermediate wirings H7 and H8 are electrically disconnected from the lower layer wiring H1 and the upper layer wiring H6, and are used for a current pathway different from that of the lower layer wiring H1 and the upper layer wiring H6. Here, the intermediate layers refer to conductive layers provided between the lower layer wiring H1 and the upper layer wiring H6. For example, the intermediate layers may include a wiring, an electrode, and a buried conductor.

The lower layer wiring H1 and the intermediate wiring H2 are connected to each other via conductors B1, the intermediate wiring H2 and the intermediate wiring H3 are connected to each other via conductors B2, the intermediate wiring H3 and the intermediate wiring H4 are connected to each other via conductors B3, the intermediate wiring H4 and the intermediate wiring H5 are connected to each other via conductors B4, and the intermediate wiring H5 and the upper layer wiring H6 are connected to each other via conductors B5.

Moreover, metal such as aluminum (Al), cupper (Cu), and the like may be used as a material of the lower layer wiring H1, the upper layer wiring H6 and, the intermediate wirings H2 to H5, H7, and H8. As a material of the conductors B5 to B1, for example, metal such as Al, Cu, tungsten (W), and the like may be used, and polycrystalline silicon doped with an impurity may be used.

Further, each of the conductors B1 to B5 may be arranged in a matrix form, and each of the conductors B1 and B5 are arranged in four rows and four columns in an example of FIG. 1. Further, a shape of the conductors B1 to B5 may be a cylindrical shape or a prismatic shape. Further, a buried electrode that is buried in an insulator may be used as the conductors B1 and B5. The insulator may be formed from a silicon dioxide film and the like.

Here, the number of the conductors B2 to B4, connected between the intermediate wirings H2 to H5, on the drawn side of the lower layer wiring H1 and the upper layer wiring H6 is small compared to the conductors B1 and B5 connected to the lower layer wiring H1 or the upper layer wiring H6. For example, in the example of FIG. 1, the respective conductors B2 and B4 are arranged in four rows and three columns such that one column on the drawn side of the lower layer wiring H1 and the upper layer wiring H6 is removed. The conductors B3 are arranged in four rows and two columns such that two columns on the drawn side of the lower layer wiring H1 and the upper layer wiring H6 are removed.

A current I flowing through the upper layer wiring H6 is led to the lower layer wiring H1 by successively passing through the conductors B5 to B1. Then, the current I flowing through the upper layer wiring H6 is turned back in the lower layer wiring H1 and thus, a current I flows in a direction opposite to a direction in which the current flows through the upper layer wiring H6.

Here, when the numbers of the respective conductors B1 to B5 are all equal to one another, a current path on the drawn side of the lower layer wiring H1 and the upper layer wiring H6 is P1, and a current path on the outside is P0. The current path P1 is shorter than the current path P0 and thus, has a low resistance, and a current passing through the current path P1 is greater than a current passing through the current path P0. In this instance, when the current passing through the current path P1 exceeds an expected value, the conductors B1 to B5 on the current path P1 are broken due to the Joule heat.

On the other hand, on the drawn side of the lower layer wiring H1 and the upper layer wiring H6, when the numbers of the respective conductors B2 to B4 are small compared to the numbers of the respective conductors B1 and B5, a current path on the drawn side of the lower layer wiring H1 and the upper layer wiring H6 is P2. That is, a vertical current pathway of the current path P2 on the drawn side of the lower layer wiring H1 and the upper layer wiring H6 is longer than a vertical current pathway of the current path P0 on the outside. Accordingly, the current path P2 is longer than the current path P1 and thus, may have an increased resistance. As a result, a current passing through the current path P2 may be decreased, and the conductors B1 to B5 on the current path P2 may be prevented from being broken due to the Joule heat.

Note that, although a method of providing the intermediate wirings H2 to H5 in four layers between the lower layer wiring H1 and the upper layer wiring H6 has been described in the example of FIG. 1, the number of layers is not limited thereto as long as intermediate wirings provided between the lower layer wiring H1 and the upper layer wiring H6 are two layers or more. Further, a method of arranging the respective conductors B1 and B5 in four rows and four columns has been described in the example of FIG. 1. However, the number of columns and the number of rows in a matrix arrangement are not limited thereto.

Second Embodiment

Figure 2:
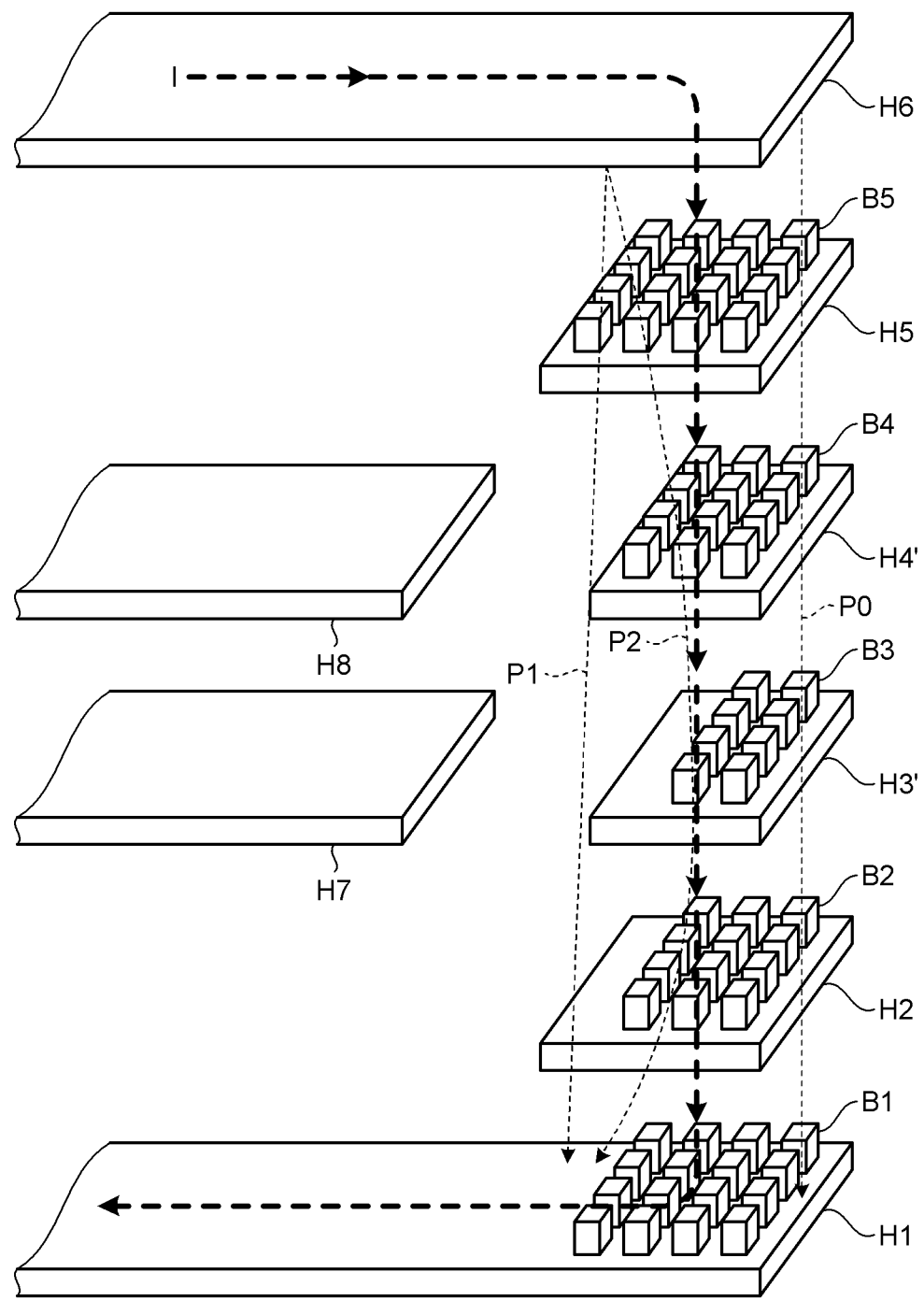
FIG. 2 is a perspective view illustrating a schematic configuration of a semiconductor device disassembled into respective wiring layers according to a second embodiment.

FIG. 2 is a perspective view illustrating a schematic configuration of a semiconductor device disassembled into respective wiring layers according to a second embodiment.

Referring to FIG. 2, in this embodiment, intermediate wirings H3' and H4' are provided instead of the intermediate wirings H3 and H4 of FIG. 1. While the intermediate wirings H3 and H4 have the same size as that of the intermediate wirings H1 and H5, the intermediate wirings H3' and H4' have a smaller size than that of intermediate wirings H1 and H5. In particular, in the intermediate wiring H4', one column of conductors B4 on the drawn side of a lower layer wiring H1 and a upper layer wiring H6 is removed, and a portion of the intermediate wiring H4' where the one column is arranged is removed. In the intermediate wiring H3', two columns of conductors B3 on the drawn side of the lower layer wiring H1 and the upper layer wiring H6 are removed, and a portion of the intermediate wiring H3' where one column of the conductors is arranged is removed.

Third Embodiment

Figure 3:
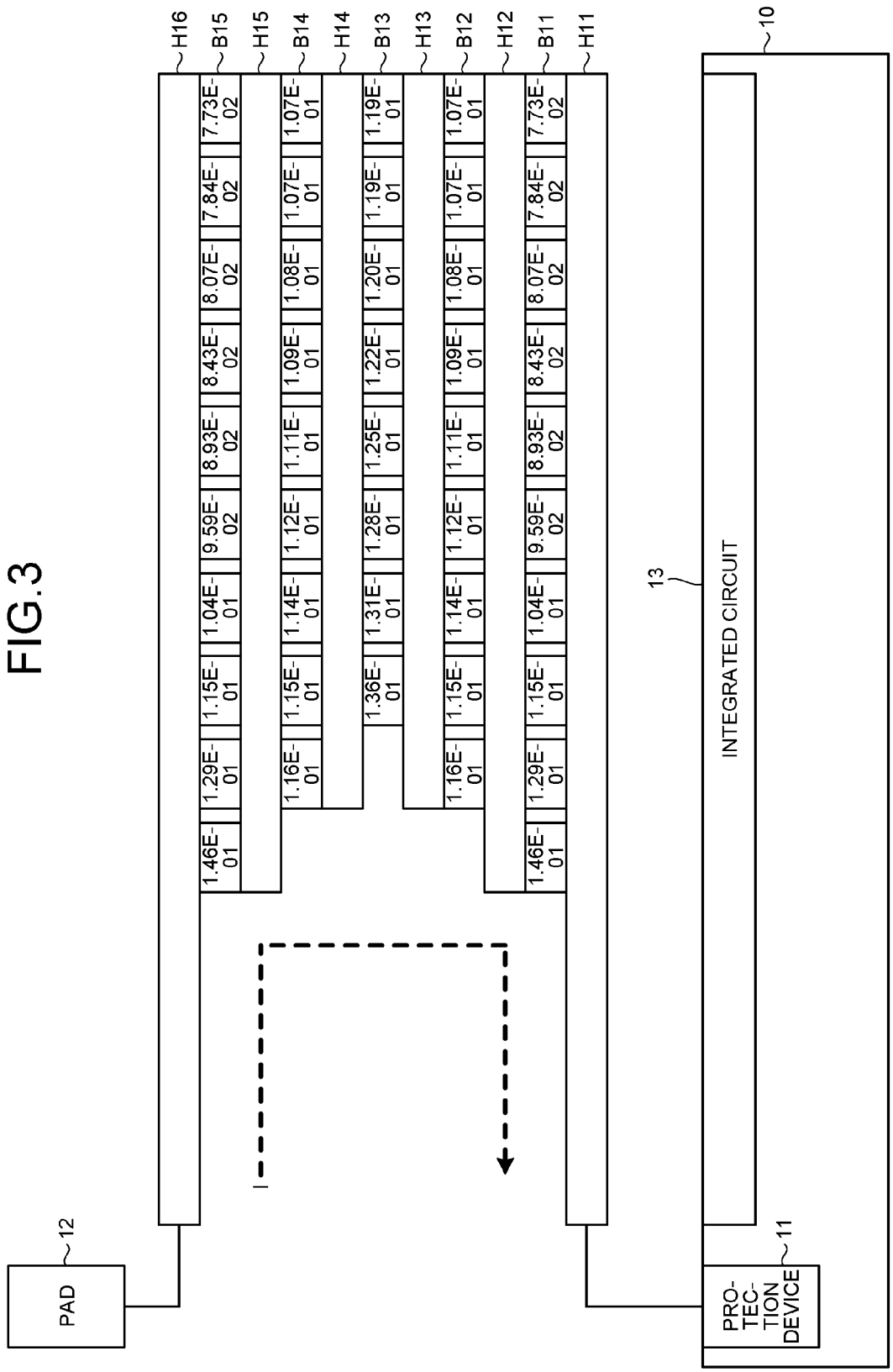
FIG. 3 is a cross-sectional view illustrating a numerical example of a current flowing through respective conductors of a semiconductor device according to a third embodiment.

FIG. 3 is a cross-sectional view illustrating a numerical example of a current flowing through respective conductors of a semiconductor device according to a third embodiment.

Moreover, FIG. 3 illustrates an example in which conductors B11 to B15 are arranged in ten columns. Further, numerical values indicated within the respective conductors B11 to B15 are values of currents individually flowing through the respective conductors B11 to B15 when a current flowing through the entire intermediate wirings H12 to H15 is set to 1 A.

Referring to FIG. 3, a lower layer wiring H11 is formed over a semiconductor substrate 10, and an upper layer wiring H16 is formed over the lower layer wiring H11. Here, the lower layer wiring H11 and the upper layer wiring H16 are drawn in the same direction. Further, a protection device 11 and an integrated circuit 13 are formed in the semiconductor substrate 10, and a pad 12 is formed over the semiconductor substrate 10. Moreover, the protection device 11 may be, for example, an electrostatic protection device such as a diode. Then, the lower layer wiring H11 is connected to the protection device 11, and the upper layer wiring H16 is connected to the pad 12.

Further, the intermediate wirings H12 to H15 are provided in four layers between the lower layer wiring H11 and the upper layer wiring H16. Moreover, the lower layer wiring H11 and the intermediate wiring H12 are connected to each other via the conductors B11, the intermediate wiring H12 and the intermediate wiring H13 are connected to each other via the conductors B12, the intermediate wiring H13 and the intermediate wiring H14 are connected to each other via the conductors B13, the intermediate wiring H14 and the intermediate wiring H15 are connected to each other via the conductors B14, and the intermediate wiring H15 and the upper layer wiring H16 are connected to each other via the conductors B15.

Here, in the conductors B12 and B14, one column on a drawn side of the lower layer wiring H11 and the upper layer wiring H16 is removed. In the conductors B13, two columns on the drawn side of the lower layer wiring H11 and the upper layer wiring H16 are removed.

In this instance, when the conductors B12 to B14 on the drawn side of the lower layer wiring H11 and the upper layer wiring H16 are not removed, a current flowing through the first column of the conductors B11 and B15 on the drawn side of the lower layer wiring H11 and the upper layer wiring H16 is 152 mA. Further, when the conductors B12 to B14 on the drawn side of the lower layer wiring H11 and the upper layer wiring H16 are not removed, a current flowing through the tenth column of the conductors B11 and B15 on the drawn side of the lower layer wiring H11 and the upper layer wiring H16 is 74.3 mA.

On the other hand, as illustrated in FIG. 3, when the conductors B12 to B14 on the drawn side of the lower layer wiring H11 and the upper layer wiring H16 are removed, a current flowing through the first column of the conductors B11 and B15 on the drawn side of the lower layer wiring H11 and the upper layer wiring H16 is 146 mA. Further, when the conductors B12 to B14 on the drawn side of the lower layer wiring H11 and the upper layer wiring H16 are removed, a current flowing through the tenth column of the conductors B11 and B15 on the drawn side of the lower layer wiring H11 and the upper layer wiring H16 is 77.3 mA.

Thus, while a current flowing through the conductors B11 and B15 on the drawn side of the lower layer wiring H11 and the upper layer wiring H16 decreases, a current flowing through the conductors B11 and B15 on the outside increases. As a result, by removing the conductors B12 to B14 on the drawn side of the lower layer wiring H11 and the upper layer wiring H16, a uniformity of a current flowing through respective columns of the conductors B11 and B15 may be enhanced, and a concentration of a current on a portion of the conductors B11 and B15 on the drawn side may be relieved. Accordingly, a resistance against a thermal destruction of the conductors B11 and B15 may be enhanced.

Fourth Embodiment

Figure 4:
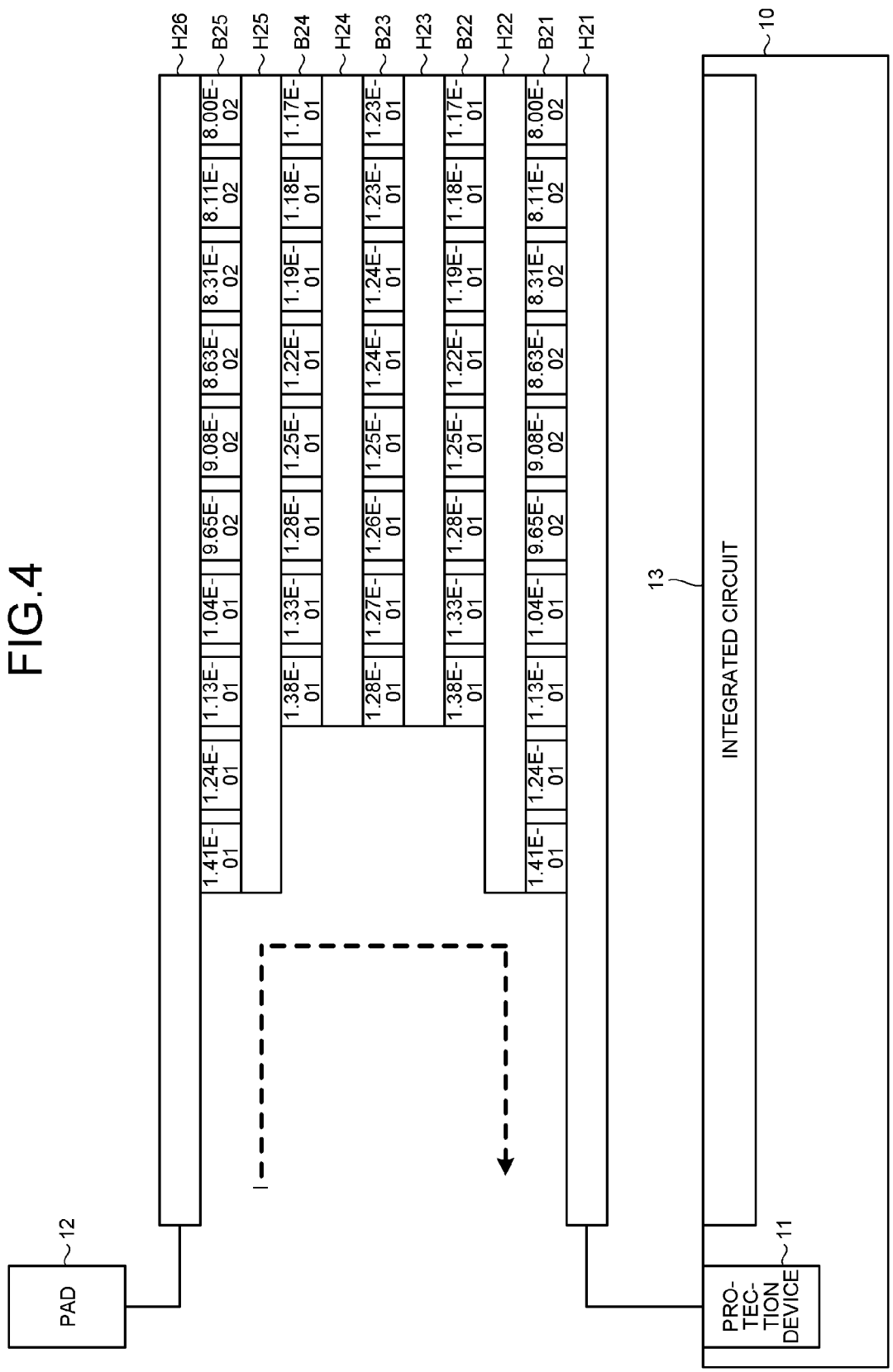
FIG. 4 is a cross-sectional view illustrating a numerical example of a current flowing through respective conductors of a semiconductor device according to a fourth embodiment.

FIG. 4 is a cross-sectional view illustrating a numerical example of a current flowing through respective conductors of a semiconductor device according to a fourth embodiment. Moreover, FIG. 4 illustrates an example in which conductors B21 to B25 are arranged in ten columns. Further, numerical values indicated within the respective conductors B21 to B25 are values of currents individually flowing through the respective conductors B21 to B25 when a current flowing through the entire intermediate wirings H22 to H25 is set to 1 A.

Referring to FIG. 4, a lower layer wiring H21 is formed over a semiconductor substrate 10, and an upper layer wiring H26 is formed over the lower layer wiring H21. Here, the lower layer wiring H21 and the upper layer wiring H26 are drawn in the same direction. Further, a protection device 11 and an integrated circuit 13 are formed in the semiconductor substrate 10, and a pad 12 is formed over the semiconductor substrate 10. Then, the lower layer wiring H21 is connected to the protection device 11, and the upper layer wiring H26 is connected to the pad 12.

Further, the intermediate wirings H22 to H25 are provided in four layers between the lower layer wiring H21 and the upper layer wiring H26. Moreover, the lower layer wiring H21 and the intermediate wiring H22 are connected to each other via the conductors B21, the intermediate wiring H22 and the intermediate wiring H23 are connected to each other via the conductors B22, the intermediate wiring H23 and the intermediate wiring H24 are connected to each other via the conductors B23, the intermediate wiring H24 and the intermediate wiring H25 are connected to each other via the conductors B24, and the intermediate wiring H25 and the upper layer wiring H26 are connected to each other via the conductors B25.

Here, in the conductors B22 to B24, two columns on a drawn side of the lower layer wiring H21 and the upper layer wiring H26 are removed.

In this instance, when the conductors B22 to B24 on the drawn side of the lower layer wiring H21 and the upper layer wiring H26 are not removed, a current flowing through the first column of the conductors B21 and B25 on the drawn side of the lower layer wiring H21 and the upper layer wiring H26 is 152 mA. Further, when the conductors B22 to B24 on the drawn side of the lower layer wiring H21 and the upper layer wiring H26 are not removed, a current flowing through the tenth column of the conductors B21 and B25 on the drawn side of the lower layer wiring H21 and the upper layer wiring H26 is 74.3 mA.

On the other hand, as illustrated in FIG. 4, when the conductors B22 to B24 on the drawn side of the lower layer wiring H21 and the upper layer wiring H26 are removed, a current flowing through the first column of the conductors B21 and B25 on the drawn side of the lower layer wiring H21 and the upper layer wiring H26 is 141 mA. Further, when the conductors B22 to B24 on the drawn side of the lower layer wiring H21 and the upper layer wiring H26 are removed, a current flowing through the tenth column of the conductors B21 and B25 on the drawn side of the lower layer wiring H21 and the upper layer wiring H26 is 80.0 mA.

As a result, by removing the conductors B22 to B24 on the drawn side of the lower layer wiring H21 and the upper layer wiring H26, a uniformity of a current flowing through respective columns of the conductors B21 and B25 may be enhanced, and a concentration of a current on a portion of the conductors B21 and B25 on the drawn side may be relieved. Accordingly, a resistance against a thermal destruction of the conductors B21 and B25 may be enhanced. Further, comparing to a method of FIG. 3, by increasing the number of conductors removed from the conductors B22 to B24 on the drawn side of the lower layer wiring H21 and the upper layer wiring H26, a uniformity of a current flowing through respective columns of the conductors B21 and B25 may be further enhanced.

Fifth Embodiment

Figure 5:
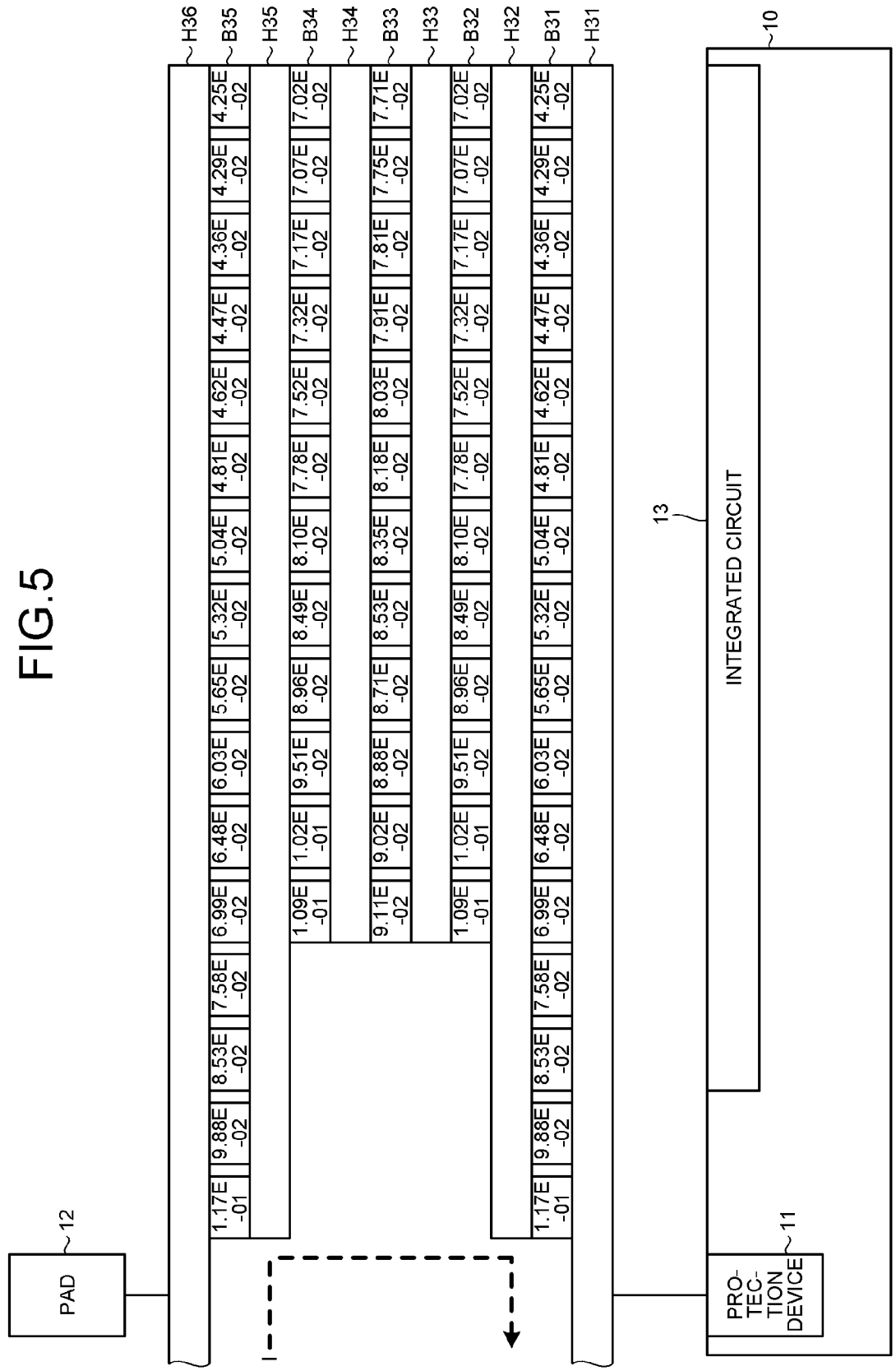
FIG. 5 is a cross-sectional view illustrating a numerical example of a current flowing through respective conductors of a semiconductor device according to a fifth embodiment.

FIG. 5 is a cross-sectional view illustrating a numerical example of a current flowing through respective conductors of a semiconductor device according to a fifth embodiment. Moreover, FIG. 5 illustrates an example in which conductors B31 to B35 are arranged in sixteen columns. Further, numerical values indicated within the respective conductors B31 to B35 are values of currents individually flowing through the respective conductors B31 to B35 when a current flowing through the entire intermediate wirings H32 to H35 is set to 1 A.

Referring to FIG. 5, a lower layer wiring H31 is formed over a semiconductor substrate 10, and an upper layer wiring H36 is formed over the lower layer wiring H31. Here, the lower layer wiring H31 and the upper layer wiring H36 are drawn in the same direction. Further, a protection device 11 and an integrated circuit 13 are formed in the semiconductor substrate 10, and a pad 12 is formed over the semiconductor substrate 10. Then, the lower layer wiring H31 is connected to the protection device 11, and the upper layer wiring H36 is connected to the pad 12.

Further, the intermediate wirings H32 to H35 are provided in four layers between the lower layer wiring H31 and the upper layer wiring H36. Moreover, the lower layer wiring H31 and the intermediate wiring H32 are connected to each other via the conductors B31, the intermediate wiring H32 and the intermediate wiring H33 are connected to each other via the conductors B32, the intermediate wiring H33 and the intermediate wiring H34 are connected to each other via the conductors B33, the intermediate wiring H34 and the intermediate wiring H35 are connected to each other via the conductors B34, and the intermediate wiring H35 and the upper layer wiring H36 are connected to each other via the conductors B35.

Here, in the conductors B32 to B34, four columns on a drawn side of the lower layer wiring H31 and the upper layer wiring H36 are removed.

In this instance, when the conductors B32 to B34 on the drawn side of the lower layer wiring H31 and the upper layer wiring H36 are not removed, a current flowing through the first column of the conductors B31 and B35 on the drawn side of the lower layer wiring H31 and the upper layer wiring H36 is 133 mA. Further, when the conductors B32 to B34 on the drawn side of the lower layer wiring H31 and the upper layer wiring H36 are not removed, a current flowing through the sixteenth column of the conductors B31 and B35 on the drawn side of the lower layer wiring H31 and the upper layer wiring H36 is 34.8 mA.

On the other hand, as illustrated in FIG. 5, when the conductors B32 to B34 on the drawn side of the lower layer wiring H31 and the upper layer wiring H36 are removed, a current flowing through the first column of the conductors B31 and B35 on the drawn side of the lower layer wiring H31 and the upper layer wiring H36 is 117 mA. Further, when the conductors 32 to B34 on the drawn side of the lower layer wiring H31 and the upper layer wiring H36 are removed, a current flowing through the sixteenth column of the conductors B31 and B35 on the drawn side of the lower layer wiring H31 and the upper layer wiring H36 is 42.5 mA.

As a result, by removing the conductors B32 to B34 on the drawn side of the lower layer wiring H31 and the upper layer wiring H36, a uniformity of a current flowing through respective columns of the conductors B31 and B35 may be enhanced, and a concentration of a current on a portion of the conductors B31 and B35 on the drawn side may be relieved. Accordingly, a resistance against a thermal destruction of the conductors B31 and B35 may be enhanced. Further, comparing to a method of FIG. 4, by increasing the number of conductors B31 to B35 arranged in a matrix, a uniformity of a current flowing through respective columns of the conductors B31 and B35 may be further enhanced.

Sixth Embodiment

Figure 6:
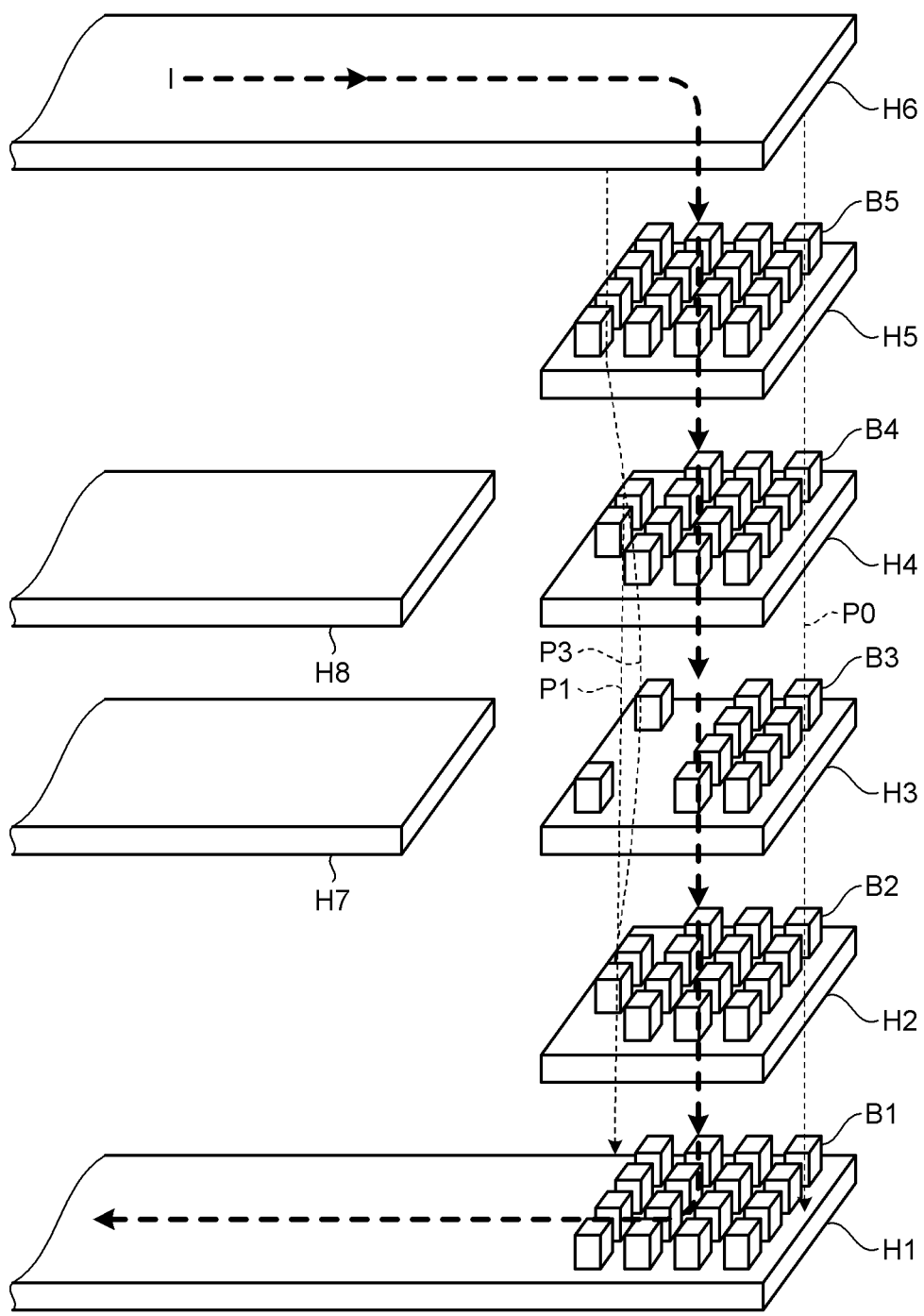
FIG. 6 is a perspective view illustrating a schematic configuration of a semiconductor device disassembled into respective wiring layers according to a sixth embodiment.

FIG. 6 is a perspective view illustrating a schematic configuration of a semiconductor device disassembled into respective wiring layers according to a sixth embodiment.

In the conductors B2 and B4 of FIG. 1, the entire one column on the drawn side of the lower layer wiring H1 and the upper layer wiring H6 is removed, and in the conductors B3 of FIG. 1, the entire two columns on the drawn side of the lower layer wiring H1 and the upper layer wiring H6 are removed.

On the other hand, in conductors B2 to B4 of FIG. 6, a portion of one column on a drawn side of a lower layer wiring H1 and an upper layer wiring H6 is removed. In this instance, in the conductors B2 to B4, positions where the conductors B2 to B4 are removed vary for each intermediate layer. For example, in the conductors B2 and B4, only conductors arranged on the outside of one column of the conductors B2 and B4 on the drawn side of the lower layer wiring H1 and the upper layer wiring H6 may be removed, and in the conductors B3, conductors arranged on the inside of one column and the entire second column of the conductors B3 on the drawn side of the lower layer wiring H1 and the upper layer wiring H6 may be removed.

In this instance, a current flowing on the drawn side of the lower layer wiring H1 and the upper layer wiring H6 meanders depending on positions of the conductors B2 to B4 and thus, a current path P3 on the drawn side of the lower layer wiring H1 and the upper layer wiring H6 is P3. Accordingly, the current path P3 may be longer than a current path P1, and a resistance may be increased. That is, a vertical current pathway of the current path P3 on the drawn side of the lower layer wiring H1 and the upper layer wiring H6 is longer than a vertical current pathway of a current path P0 on the outside. As a result, a current passing through the current path P3 may be decreased, and the conductors B1 to B5 on the current path P3 may be prevented from being broken due to the Joule heat.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a lower layer wiring; and
an upper layer wiring disposed over the lower layer wiring interposing two or more layers of intermediate wirings and conductors connecting respective wirings between the lower layer wiring and the upper layer wiring, the upper layer wiring drawn in the same direction as a direction in which the lower layer wiring is drawn,
wherein the two or more layers of intermediate wirings comprise:
a first intermediate wiring between the lower layer wiring and the upper layer wiring, and
a second intermediate wiring between the first intermediate wiring and the upper layer wiring, and
wherein the conductors comprise:
a plurality of first conductors connecting the lower layer wiring and the first intermediate wiring,
a plurality of second conductors connecting the upper layer wiring and the second intermediate wiring, and
a plurality of third conductors connecting the first intermediate wiring and the second intermediate wiring, the plurality of third conductors less in number than the first conductors or the second conductors on a drawn side of the lower layer wiring and the upper layer wiring.

2. The semiconductor device according to claim 1,
wherein one or more intermediate wirings is further provided between the first intermediate wiring and the second intermediate wiring, and
the third conductors comprise a plurality of fourth conductors which connect at least two neighboring intermediate wirings in a vertical direction between the first intermediate wiring and the second intermediate wiring.

3. The semiconductor device according to claim 2,
wherein the first conductors, the second conductors, and the third conductors are arranged in a matrix form, respectively, and
at least one column of the third conductors on the drawn side of the lower layer wiring and the upper layer wiring is removed over a plurality of layers when compared to the first conductors and the second conductors.

4. The semiconductor device according to claim 2,
wherein the first conductors, the second conductors, and the third conductors are arranged in a matrix form, respectively, and the third conductors on the drawn side of the lower layer wiring and the upper layer wiring are arranged differently over a plurality of layers than the first conductors and the second conductors.

5. The semiconductor device according to claim 1,
wherein the first conductors, the second conductors, and the third conductors are arranged in a matrix form, respectively, and
at least one column of the third conductors on the drawn side of the lower layer wiring and the upper layer wiring is removed when compared to the first conductors and the second conductors.

6. The semiconductor device according to claim 1,
wherein the upper layer wiring is connected to a pad formed over a semiconductor substrate, and
the lower layer wiring is connected to a protection device in the semiconductor substrate.

7. The semiconductor device according to claim 6, further comprising an integrated circuit in the semiconductor substrate.

8. The semiconductor device according to claim 1,
wherein the first conductors, the second conductors, and the third conductors comprise buried electrodes, the buried electrodes buried in an insulator.

9. The semiconductor device according to claim 1,
wherein the first conductors, the second conductors, and the third conductors are arranged in a matrix form, respectively, and the third conductors on the drawn side of the lower layer wiring and the upper layer wiring are arranged differently than the first conductors and the second conductors.

10. A semiconductor device, comprising:
a lower layer wiring;
an upper layer wiring drawn in the same direction as a direction in which the lower layer wiring is drawn;
an intermediate wiring disposed on an intermediate layer provided between the lower layer wiring and the upper layer wiring; and
a plurality of conductors connecting the lower layer wiring and the upper layer wiring via the intermediate wiring,
wherein the conductors are arranged such that a current pathway of a current path on a drawn side of the lower layer wiring and the upper layer wiring is longer than a current pathway of a current path on the outside among vertical current paths connecting the lower layer wiring and the upper layer wiring.

11. The semiconductor device according to claim 10,
wherein the intermediate wiring is provided in two or more layers one above the other, wherein a layer on which the number of the conductors connecting the wirings vertically adjacent to each other is different is provided on the drawn side of the lower layer wiring and the upper layer wiring, and wherein an equal number of the conductors are provided for each layer on the outside.

12. The semiconductor device according to claim 11,
wherein the conductors are arranged in a matrix form for each layer, and at least one column of the conductors on the drawn side of the lower layer wiring and the upper layer wiring is removed from a portion of the layers.

13. The semiconductor device according to claim 12,
wherein at least one column of the conductors on the drawn side of the lower layer wiring and the upper layer wiring is removed from a plurality of layers.

14. The semiconductor device according to claim 10, comprising a second intermediate wiring on the intermediate layer, the second intermediate layer separated from a first intermediate wiring.

15. The semiconductor device according to claim 10,
wherein the upper layer wiring is connected to a pad over a semiconductor substrate, and
the lower layer wiring is connected to a protection device in the semiconductor substrate.

16. The semiconductor device according to claim 15, further comprising an integrated circuit in the semiconductor substrate.

17. The semiconductor device according to claim 10,
wherein the conductors are buried electrodes, the buried electrodes buried in an insulator.

18. The semiconductor device according to claim 10,
wherein the intermediate wiring is provided in two or more layers one above the other, a layer on which arranged positions of the conductors connecting between the wirings vertically adjacent to each other are different is provided on the drawn side of the lower layer wiring and the upper layer wiring, and arranged positions of the conductors are equal for each layer on the outside.

19. The semiconductor device according to claim 18,
wherein arranged positions of the conductors connecting the wirings vertically adjacent to each other on the drawn side of the lower layer wiring and the upper layer wiring vary among a plurality of layers.

* * * * *